United States Patent [19]
Grätz et al.

[11] Patent Number: 6,125,066
[45] Date of Patent: Sep. 26, 2000

[54] CIRCUIT CONFIGURATION AND METHOD FOR AUTOMATIC RECOGNITION AND ELIMINATION OF WORD LINE/BIT LINE SHORT CIRCUITS

[75] Inventors: Thoralf Grätz; Patrick Heyne; Dieter Härle, all of München, Germany

[73] Assignee: Infineon Technologies AG, Munich, Germany

[21] Appl. No.: 09/277,280

[22] Filed: Mar. 26, 1999

[30] Foreign Application Priority Data

Mar. 26, 1998 [DE] Germany ............... 198 13 504

[51] Int. Cl.$^7$ ....................... G11C 7/00
[52] U.S. Cl. ................. 365/200; 365/225.7
[58] Field of Search ............... 365/200, 225.7, 365/201, 96

[56] References Cited

U.S. PATENT DOCUMENTS

| | | | |
|---|---|---|---|
| 4,485,459 | 11/1984 | Venkateswaran | 365/200 |
| 5,134,584 | 7/1992 | Boler et al. | 365/200 |
| 5,768,206 | 6/1998 | McClure | 365/225.7 |

*Primary Examiner*—David Nelms
*Assistant Examiner*—David Lam
*Attorney, Agent, or Firm*—Herbert L. Lerner; Laurence A. Greenberg; Werner H. Stemer

[57] ABSTRACT

A circuit configuration and a method for automatic recognition and elimination of word line/bit line short circuits in a memory cell configuration containing sensor amplifiers, in which the sensor amplifiers split the memory cell configuration into memory blocks. To this end, a fuse is provided in the bit lines in each memory block upstream of the respective sensor amplifiers, the fuse being blown as a result of an appropriate voltage difference being applied in a test mode.

5 Claims, 1 Drawing Sheet

6,125,066

CIRCUIT CONFIGURATION AND METHOD FOR AUTOMATIC RECOGNITION AND ELIMINATION OF WORD LINE/BIT LINE SHORT CIRCUITS

BACKGROUND OF THE INVENTION

Field of the Invention

The present invention relates to a circuit configuration and a method for automatic recognition and elimination of word line/bit line short circuits in a memory cell configuration containing sensor amplifiers and having bit lines and redundant bit lines, the sensor amplifiers split the memory cell configuration into memory blocks.

Word line/bit line short circuits are known to prevent writing to and reading from a memory cell configuration in a memory. It is therefore very important to recognize and eliminate such word line/bit line short circuits in order to be able to guarantee the operation of the memory.

Such word line/bit line short circuits occur if word lines and bit lines touch one another owing to faults or irregularities during the process of manufacturing the memory, or are connected with a low impedance by conductive dirt particles, for example.

In memories which use split sensor amplifiers in the bit lines, so that each sensor amplifier is allocated two branches of a bit line or two different bit lines, and the memory cells in the memory cell configuration are split into a total of two adjacent memory blocks, it should additionally be noted that even after a bit line short-circuited with a word line in one memory block has been replaced, correct operation of the bit line in the other memory block is disrupted. This occurs because correct precharging of the bit line in the other memory block is prevented by the short circuit between the corresponding bit line and a word line in the one memory block, so that correct reading of the corresponding memory cells of the bit line short-circuited in the one memory block is no longer possible in the other memory block.

To overcome this difficulty, it is therefore not only the defective branch of the bit line in the one memory block but, in addition, also the inherently defective branch of the bit line or a different bit line in the other memory block which has hitherto been replaced by a redundant bit line in the two memory blocks. This results in the disadvantage that, in practice, twice as many bit lines have to be provided for redundancy as when only the actually defective bit lines or their branches in the respective memory blocks need to be replaced. In other words, if the bit lines which are actually disrupted by short circuits in the two memory blocks are considered, the redundancy of the existing memory cell configurations is therefore, as far as the occurrence of word line/bit line short circuits is concerned, reduced by a factor of 2 when split sensor amplifiers are used.

SUMMARY OF THE INVENTION

It is accordingly an object of the invention to provide a circuit configuration and a method for automatic recognition and elimination of word line/bit line short circuits that overcome the above-mentioned disadvantages of the prior art methods and devices of this general type, with which it is possible to increase the redundancy in the event of such faults occurring, in order to achieve improved efficiency.

With the foregoing and other objects in view there is provided, in accordance with the invention, an improved circuit configuration for automatic recognition and elimination of word line/bit line short circuits in a memory cell having sensor amplifiers, bit lines and redundant bit lines, the sensor amplifiers splitting the memory cell into memory blocks, the improvement including: a fuse disposed in the bit lines upstream of the sensor amplifiers in each memory block.

The invention thus provides a fuse in each of the bit lines upstream of the sensor amplifiers in each memory block. The fuse is activated in a test mode, so that the relevant short-circuited bit line in the corresponding memory block is isolated from the sensor amplifier. The branch of the corresponding bit line in the other memory block is thus able to operate correctly, so that in this case it is not necessary to use a redundant bit line as a replacement. Therefore, the flexibility of the redundancy of the bit lines is fully retained, because the test mode disconnects the short-circuited bit lines, by activating their fuses, from the sensor amplifiers. Hence, only the disconnected bit lines need be replaced by redundant bit lines in the respective memory blocks.

Therefore, the present invention allows a considerable simplification of the redundancy by approximately a factor of 2: only half as many redundant bit lines need be provided to replace bit lines disrupted by word line/bit line short circuits. Alternatively, it is also possible to use the redundant bit lines which are thus "saved" to eliminate other faults, which improves efficiency.

The respective fuses in the bit lines can be activated during the test mode in a variety of ways: for example, it is possible to provide a transistor for activating the fuses between the respective fuses and sensor amplifiers. In the test mode, the word lines are then activated in succession, and the bit lines are isolated from one another by precharge and muxing transistors provided in the sensor amplifiers switching off. Therefore, the bit lines are isolated by the sensor amplifiers, so that one branch of the same bit line in the one memory block is isolated from the other branch of the same bit line in the other memory block. If there is now a short circuit between the activated word line and a bit line branch, then the bit line branch is at virtually the same, high potential as the word line. If the bit line branch is then pulled to a correspondingly low potential using a transistor placed between the fuse of this bit line branch and the sensor amplifier, then the fuse in the bit line branch is activated, and the bit line branch is isolated from the sensor amplifier.

Thus, the short-circuited bit line branch no longer disrupts the operation of the other branch of the same bit line or else a different bit line, so that the other branch does not need to be replaced by a redundant bit line. It is therefore sufficient if only the one defective branch of the bit line in the one memory block is replaced by a redundant bit line.

It is not absolutely essential for the transistor situated between the fuse and the sensor amplifier to be provided. This is because, if necessary, it is also possible to use the normal write path: to this end, in the write cycle, a low (zero) voltage is applied to the sensor amplifier and/or at the same time a high voltage is applied to the word line. As a result of the voltage difference this causes with respect to the short-circuited word line, the corresponding fuse is blown in the test mode.

In this case, the invention provides a simple remedy by providing fuses in the respective bit lines.

Other features which are considered as characteristic for the invention are set forth in the appended claims.

Although the invention is illustrated and described herein as embodied in a circuit configuration and a method for automatic recognition and elimination of word line/bit line short circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
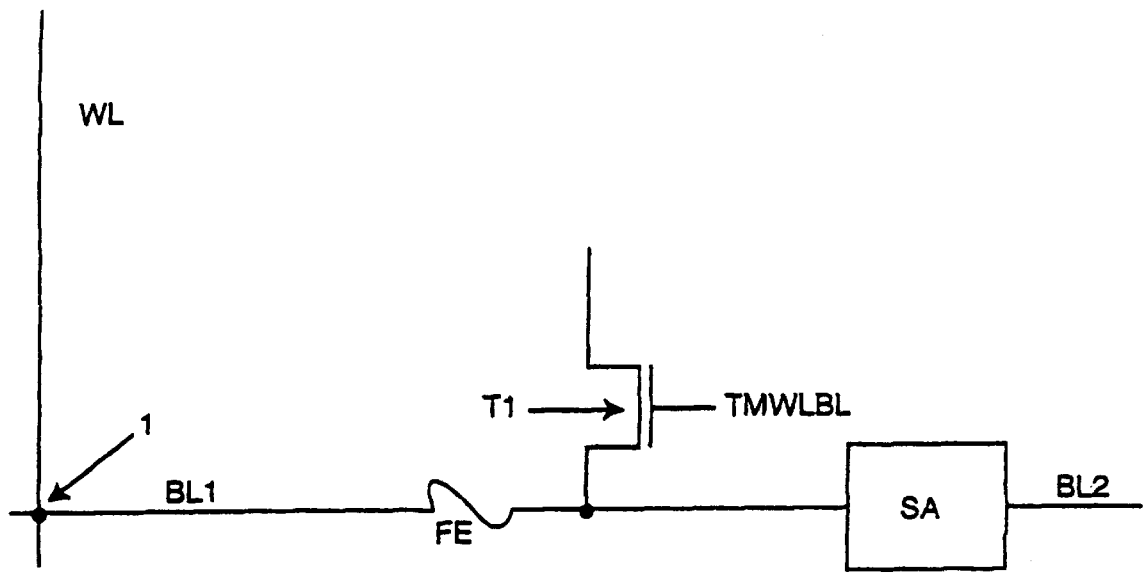
FIG. 1 is a diagrammatic illustration of a circuit diagram with a bit line and a word line according to the invention.

In all the figures of the drawing, sub-features and integral parts that correspond to one another bear the same reference symbol in each case. Referring now to the figures of the drawing in detail and first, particularly, to FIG. 2 thereof, there is shown a prior art memory cell configuration having word lines WL1, WL2, WL3, . . . , bit lines BL1, BL2 and $\overline{BL1}, \overline{BL2}$ and redundant bit lines RBL, $\overline{RBL}$. The bit lines BL1, BL2 and $\overline{BL1}, \overline{BL2}$ can each be two branches of the same bit line or else two different bit lines. Memory cells having transistors T and capacitors C are located at points where the bit lines BL1, BL2 and $\overline{BL1}, \overline{BL2}$ intersect the word lines WL1, WL2, WL3, . . . . In this case, for architectural and space reasons, only every second intersection of word lines and bit lines is occupied by such memory cells. The electrodes, remote from the transistors T, of the capacitors C each have a constant voltage of, for example, 0.9 V, applied to them.

Figure 2:
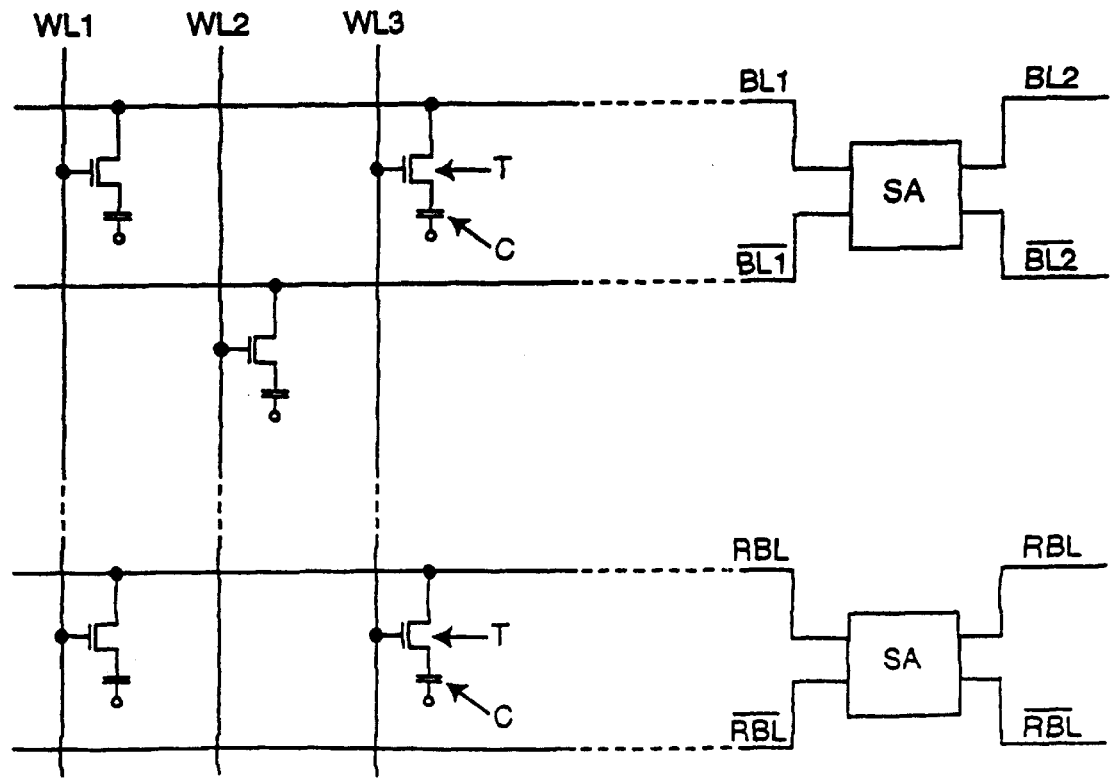
FIG. 2 is a circuit illustration of a prior art circuit configuration.

As shown in FIG. 2, the bit lines BL1, BL2 and $\overline{BL1}, \overline{BL2}$ are subdivided into two branches in each case by a sensor or read amplifier SA. The sensor amplifiers SA contain precharge and muxing transistors (not shown). The muxing transistors switch on the "left-hand" or "right-hand" branch of a bit line BL1, BL2 or $\overline{BL1}, \overline{BL2}$, respectively.

The bit line $\overline{BL1}, \overline{BL2}$ is used as a reference line with a reference voltage of 0.9 V for the sensor amplifier SA whenever the bit line BL1, BL2 is being read. Conversely, the bit line BL1, BL2 is used as a reference line for the sensor amplifier SA with a reference voltage of 0.9 V whenever the bit line $\overline{BL1}$, $\overline{BL2}$ is being read.

The redundant bit lines RBL and $\overline{RBL}$ are configured in the same way as explained above for the bit lines.

In the circuit configuration, if a short circuit occurs between the bit line BL1, BL2 and the word line WL1, for example, then not only the bit line branch (BL1) of the bit line BL1, BL2 "to the left" of the sensor amplifier SA, but also the branch (BL2) to the right of this sensor amplifier SA is disrupted, as explained above, so that the disrupted bit line needs to be replaced by the redundant bit line RBL (or $\overline{RBL}$).

FIG. 1 shows a similar circuit according to the invention in which a word line WL has a short circuit with the bit line BL1, BL2 at an intersection point 1. The word line WL thus corresponds, for example, to the word line WL1 shown in FIG. 2, while the bit line BL1, BL2 is to be associated with the bit line BL1, BL2 shown in FIG. 2. If such a short circuit occurs, then not only is the branch (BL1) of the bit line BL1, BL2 on the "left-hand" side of a sensor amplifier SA disrupted, but also the branch (BL2) of the bit line BL1, BL2 on the "right-hand" side of the sensor amplifier SA. Therefore, the bit lines in both memory blocks are disrupted. It should once again be noted that the lines BL1, BL2 may be two branches of the same bit line or else two different bit lines.

Now, to avoid having to replace the branch of the bit line BL2 on the "right-hand" side of the sensor amplifier SA by a redundant bit line as well, a fuse FE is provided between the intersection 1 and the sensor amplifier SA, and the fuse "blows" and interrupts the electrical connection if a specific threshold voltage is exceeded. Such fuses are provided in all the bit lines BL1, BL2 (and $\overline{BL1}, \overline{BL2}$) connected to the sensor amplifier SA.

In a test mode, the word lines WL are activated in succession and the bit lines BL1, BL2 are isolated from one another by the precharge and muxing transistors in the sensor amplifiers SA being switched off. Therefore, in FIGS. 1 and 2, the "left-hand" and "right-hand" branches of the bit lines BL1, BL2 are all isolated from one another after the precharge and muxing transistors have switched off. If there is now a short circuit between an activated word line WL and a bit line BL1, then the bit line BL1 is virtually at the high potential of the word line WL as a result of the short circuit. If, in this state, the bit line BL1 is pulled to a correspondingly low potential by a transistor T1 branched off between the fuse FE and the sensor amplifier SA, the fuse FE is activated, so that the corresponding branch of the bit line BL1 is disconnected from the sensor amplifier SA. To make this disconnection possible, the transistor T1 is switched on at its gate by an appropriate signal TMWLBL, so that the low potential reaches the node point between the fuse FE and the sensor amplifier SA via the source/drain path of the transistor T1.

If appropriate, the transistor T1 can also be dispensed with. In this case, a low "special voltage" is applied to the sensor amplifier SA in the write cycle while a correspondingly high voltage is supplied to the word line WL. If the voltage difference between the special voltage and the high voltage is sufficiently large, then the fuse FE is blown in the event of a short circuit between the word line WL and the bit line BL1.

The invention thus enables a circuit configuration and a method with which, in a test mode, the word lines are activated in succession and the bit lines are isolated from one another by the precharge and muxing transistors switching off. If there is a short circuit present between an activated word line and a bit line, in the test mode, the bit line is virtually at the high potential of the word line. In this case, the fuse FE provided in the bit line BL1, B12 is activated in order to isolate the short-circuited bit line BL1, BL2 or its branch from the sensor amplifier SA.

Therefore, the number of redundant bit lines that have to be provided can be significantly reduced. Alternatively, it is also possible to use the redundant bit lines which are thus "saved" to eliminate other faults, which increases the overall efficiency.

We claim:

1. An improved circuit configuration for automatic recognition and elimination of word line/bit line short circuits in a memory cell configuration having sensor amplifiers, bit lines and redundant bit lines, the sensor amplifiers splitting the memory cell configurations into memory blocks, the improvement comprising:

a fuse disposed in the bit lines upstream of the sensor amplifiers in each memory block, said fuse activated by applying a voltage.

2. The circuit configuration according to claim 1, including a transistor disposed between said fuse and said sensor amplifier.

3. The circuit configuration according to claim 1, wherein said fuse can be activated by applying at least one of a special voltage to said sensor amplifier and an increased voltage to a word line.

4. A method for automatic recognition and elimination of word line/bit line short circuits in a memory cell configuration having sensor amplifiers, bit lines and redundant bit lines, the sensor amplifiers splitting the memory cell configuration into memory blocks, which comprises:

during a test mode, disconnecting bit lines having short circuits with word lines by activating fuses in the bits lines, and performing the activating step by applying a voltage to the fuses.

5. The method according to claim 4, which comprises activating the fuses by supplying voltages having an appropriate voltage difference between the word lines and the bit lines.

* * * * *